US011531064B2

(12) United States Patent
Brivio et al.

(10) Patent No.: US 11,531,064 B2
(45) Date of Patent: Dec. 20, 2022

(54) METHOD FOR TESTING A DIGITAL ELECTRONIC CIRCUIT TO BE TESTED, CORRESPONDING TEST SYSTEM AND COMPUTER PROGRAM PRODUCT

(71) Applicant: STMicroelectronics S.r.l., Agrate Brianza (IT)

(72) Inventors: Matteo Brivio, Cornate d'Adda (IT); Matteo Venturelli, Lonato del Garda (IT); Nicola De Campo, Cura Carpignano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/514,568

(22) Filed: Oct. 29, 2021

(65) Prior Publication Data

US 2022/0137131 A1     May 5, 2022

(30) Foreign Application Priority Data

Nov. 4, 2020    (IT) ..................... 102020000026296

(51) Int. Cl.
    *G01R 31/3183*     (2006.01)
    *G01R 31/28*     (2006.01)
    *G01R 31/317*     (2006.01)
    *G11C 29/56*     (2006.01)
    *G01R 31/30*     (2006.01)
    *G11C 29/02*     (2006.01)

(52) U.S. Cl.
CPC . *G01R 31/318307* (2013.01); *G01R 31/2879* (2013.01); *G01R 31/30* (2013.01); *G01R 31/3004* (2013.01); *G01R 31/31721* (2013.01); *G01R 31/318371* (2013.01); *G11C 29/021* (2013.01); *G11C 29/56* (2013.01); *G11C 2029/5602* (2013.01)

(58) Field of Classification Search
CPC ........ G01R 31/318307; G01R 31/2879; G01R 31/30; G01R 31/3004; G01R 31/31721; G01R 31/318371; G11C 29/021; G11C 29/56; G11C 2029/5602
USPC .................. 714/738, 740, 742, 745; 327/540
See application file for complete search history.

(56) References Cited

U.S. PATENT DOCUMENTS

| 6,545,530 | B1 * | 4/2003 | Jordan ...................... G05F 3/30 |
| | | | 327/540 |
| 7,705,600 | B1 | 4/2010 | Byrkett |
| 7,880,452 | B1 | 2/2011 | Prasad et al. |
| 9,588,171 | B2 * | 3/2017 | Ilkov .................. G01R 31/2621 |
| 9,823,282 | B2 * | 11/2017 | Narayanan ......... G01R 31/3004 |

(Continued)

*Primary Examiner* — John J Tabone, Jr.
(74) *Attorney, Agent, or Firm* — Slater Matsil, LLP

(57) ABSTRACT

In an embodiment a method for testing a digital electronic circuit includes coupling an external test equipment to a digital electronic circuit in order to apply an external voltage signal to the digital electronic circuit when an automatic test pattern generation (ATPG) procedure with a given test pattern is performed, wherein a value of the external voltage signal is controlled by the external test equipment and measuring, at the external test equipment, the digital supply voltage at an output of the voltage regulator and at an input of the internal digital circuitry, wherein the external voltage signal is applied to the differential inputs of the op-amp voltage regulator through an adaptation circuit to obtain determined values of the digital supply voltage.

18 Claims, 9 Drawing Sheets

(56) References Cited

U.S. PATENT DOCUMENTS

| | | | |
|---|---|---|---|
| 10,867,684 B1* | 12/2020 | Piccardi | G11C 16/08 |
| 2005/0040841 A1 | 2/2005 | Iadanza | |
| 2006/0202707 A1* | 9/2006 | Harjung | G01R 31/3004 |
| | | | 324/756.04 |
| 2010/0169037 A1* | 7/2010 | Hopkins | G11C 29/50 |
| | | | 702/117 |
| 2017/0237424 A1* | 8/2017 | Wilz | H03K 19/018507 |
| | | | 327/384 |
| 2018/0212476 A1* | 7/2018 | Nguyen | H02J 50/60 |
| 2022/0137131 A1* | 5/2022 | Brivio | G01R 31/318307 |
| | | | 714/738 |

* cited by examiner

US 11,531,064 B2

METHOD FOR TESTING A DIGITAL ELECTRONIC CIRCUIT TO BE TESTED, CORRESPONDING TEST SYSTEM AND COMPUTER PROGRAM PRODUCT

CROSS-REFERENCE TO RELATED APPLICATIONS

This application claims the benefit of Italian Patent Application No. 102020000026296 filed on Nov. 4, 2020, which application is hereby incorporated herein by reference.

TECHNICAL FIELD

Embodiments of the present disclosure relate to solutions for a method for testing a digital electronic circuit comprising internally a voltage regulator supplying a digital supply voltage to internal digital circuitry of said electronic circuit, said voltage regulator comprising an op-amp voltage regulator having its output coupled to a differential input of the op-amp and a reference voltage coupled to the other differential input, said method comprising performing an ATPG, Automatic Test Pattern Generation, procedure comprising controlling a value of said digital supply voltage at the input of said internal digital circuitry according to a given test pattern, comprising during the execution of the ATPG procedure selectively coupling an external test equipment to the electronic circuit to apply to said electronic circuit an external signal which value is controlled by the external test equipment, and measuring the digital supply voltage at the input of the internal digital circuitry at the external test equipment.

The techniques here described apply to digital electronic circuits requiring a digital voltage supply, in particular to integrated circuits (ICs) and to digital circuits comprising logic gates.

BACKGROUND

Nowadays, automotive applications require integrated circuits which are increasingly smart, and therefore contain both a huge number of logic gates and a high number of functions/diagnosis.

Testing of such logic gates is based on dedicated ATPG pattern to screen out possible defectiveness. ATPG (Automatic Test Pattern Generation or Automatic Test Pattern Generator) is an electronic design automation method/technology used to find an input (or test) sequence that, when applied to a digital circuit, enables automatic test equipment to distinguish between the correct circuit behaviour and the faulty circuit behaviour caused by defects.

To guarantee the success of this technique it is important to identify design corner and apply the ATPG pattern in corner cases, i.e. outside normal conditions.

The identification of a design corner is obtained through "Shmoo plot" analysis, a graphical display of ATPG pattern pass/fail as IC supply voltage (VDD) and pattern period change.

Shmoo plot examples are shown in FIG. 1: pattern period PT, i.e. the inverse of the frequency at which the patterns operate the IC, and supply voltage VDD are on x-axis and y-axis respectively. ATPG pattern considered pass P, i.e. success, are depicted in green, while fail F are depicted in red.

The success of ATPG pattern depends on three factors: digital supply voltage, often called VDD, frequency and temperature corners. Frequency and temperature are easily controllable during testing procedure. On the contrary supply voltage of logic gates is quite difficult to control.

In older devices, supply voltage VDD was directly connected to a pin and could be provided easily from external source. In newer devices it is not possible to have a dedicated pin for the supply voltage VDD, due to the increased number of functions/diagnosis in a package more and more small.

It is known to tackle such problem by having inside the device a testmode switch present to remap the internal supply voltage VDD signal to an external pin. Then, the internal voltage regulator is disabled and supply voltage VDD is controlled by an external source. Finally, IC logic is configured in ATPG mode and the ATPG patterns start.

However, during ATPG patterns many logic gates are activated in sequence and spike currents are present. The testmode switch resistance, which value is here indicated with Rsw, is not negligible (usually greater than tens of Ohm) and it could not be improved due to area constraints. Spike currents causes a drop on the testmode switch resistance Rsw and VDD internal voltage could drop down to the minimum technology voltage of standard cell. In this case ATPG pattern fails, not for a defectiveness, but for testability weakness. Furthermore, the creation of Shmoo plot is particularly difficult.

FIG. 2 shows a schematic of a known circuit arrangement 10 implementing the previous concepts.

A digital electronic circuit, in particular an integrated circuit 11, comprise a digital circuit portion, represented by an integrated circuit logic 112, includes a linear regulator 111 receiving an input voltage VIN (at a terminal coupled to the drain of transistor 111b as shown in FIG. 4) and a reference voltage VREF, at a terminal me, and outputting the digital voltage supply VDD, which is supplied to the integrated circuit logic 112, coupled in parallel with respect to an output terminal LOUT, on which is formed the digital voltage supply VDD of the linear regulator 111 and a ground terminal GND of the linear regulator 111. The integrated circuit 11 includes test terminals, a force test terminal 114a, which is coupled to the output of the linear regulator 111, i.e. it is coupled to the output terminal LOUT on which is formed the digital voltage supply VDD with the interposition of a testmode switch 113, which is therefore arranged in series with respect to the output terminal LOUT, i.e., between terminals LOUT and 114a, and a ground test terminal 114b, which is coupled to ground node GND of IC logic 112.

Reference numeral 12 indicates an ATE (Automated Test Equipment) which terminals 124a and 124b are coupled to terminals 114a and 114b respectively and coupled to the terminals of a voltage source 121.

During the execution of an ATPG pattern, the regulator 111 is disabled, the testmode switch 113 on the output is closed, the integrated circuit logic 112 is configured in ATPG mode and the digital voltage supply VDD is provided as test digital voltage supply, supplying a test digital voltage supply $VDD_T$, which value nominally corresponds to that of digital voltage supply VDD, from the ATE external voltage source 121.

FIG. 3 schematically shows a circuit implementation of the arrangement 10 of FIG. 2 which may be applied.

The regulator 11 is implemented by an operational amplifier, or op-amp, voltage regulator which architecture is well known to the person skilled in the art. In any case the reference voltage VREF is fed to the positive input of an op-amp 111a, which output is coupled to the gate of a driver transistor 111*b*, a MOS transistor in the example, to which is supplied the input voltage VIN, on his drain in FIG. 3. A voltage divider FN formed by resistor R1 and R2, coupled in a central node D, brings back the output voltage taken on the source of MOS transistor 111*b* to the inverting output of op-amp 111, i.e., it represents a resistive feedback network from the output of the op-amp 111*a* to the differential input of the op-amp itself. The resistor R2 is coupled to the source of MOS transistor 111*b*, the other terminal of resistor R2 representing the central node D of the divider FN between which and ground GND is coupled the other resistor R1 of the divider FN while to the central node D is also coupled the inverting input of the op-amp 111*a*. The regulator 111 also includes on the output of the driver transistor 111*b*, i.e. its source, a regulator disabling switch 111*c*, which, when open, disconnects the source of the transistor 111*b* from the regulated voltage output node LOUT of the regulator 111. Linear regulation is determined by two factors: the reference voltage VREF at positive input of the op-amp 111*a* and the portion of output voltage $V_{LOUT}$, sensed at the negative input of op-amp 111*a* through the voltage divider FN, comprising resistors R1, R2, which value is $V_{LOUT}$*R1/(R1+R2). The voltage divider FN, as mentioned, represents a feedback network to the negative input, determining a voltage control loop, which forces the voltage on the central node D of the divider FN, coupled to inverting terminal of op-amp 111*a*, to be equal to reference voltage VREF. In this way, the ratio of the divider FN (and hence the current flowing into it) determines the value of output regulated voltage VLOUT on node LOUT as VREF*(R1+R2)/R1.

In the embodiment of FIG. 3 the testmode switch block 113 includes three switches 113*a*, 113*b* and 113*c*, switches 113*a* and 113*b* being in series to terminals 114*a* and 114*b*, i.e. interposed between output node LOUT and force test terminal 114*a* and ground node GND and ground test terminal 114*b*. A third switch 113*c* is interposed between the output node LOUT and a sensing node 114*c*. The ATE 12 includes, in addition to the voltage source 121, configured to force a respective test digital voltage supply $VDD_T$ with a high current in force terminal 114*a*, a voltage meter 122 coupled to nodes 114*c* (sensing) and 114*b* (ground), i.e. sensing the output voltage on the regulated voltage output node LOUT, which represents also the supply node of IC logic 112, in which during the execution of the ATPG test, the voltage source 121 forces its test digital voltage supply $VDD_T$. In FIG. 3 is also represented a clock signal CK supplied to the IC logic 112 to clock its operation.

During the execution of the ATPG pattern, the regulator 111 is disabled through the dedicated switch 111*c*, which is open. The IC logic 112 is configured in ATPG mode and the digital supply VDD is provided from ATE external voltage source 121 as test digital voltage supply $VDD_T$, as mentioned. The digital supply VDD internal value in the integrated circuit 11, i.e. inputting the supply terminal of IC logic 112, is read by the external voltage meter 122.

As mentioned, in the circuits of FIGS. 2 and 3, during execution of ATPG patterns many logic gates are activated in sequence and spike currents are present, causing a drop on the testmode switch resistance so that the internal digital voltage supply value may drop down to the minimum technology voltage of a standard cell. Thus, the stability of the digital voltage supply during pattern is affected, which may lead to failure of the ATPG pattern fails, not for a defectiveness, but for testability weakness, and also make difficult obtaining a Shmoo plot.

SUMMARY

Embodiments provide solutions to overcome one or more of the previously outlined drawbacks.

Embodiments moreover concerns a related system for testing, as well as a corresponding related computer program product, loadable in the memory of at least one computer and including software code portions for performing the steps of the method when the product is run on a computer. As used herein, reference to such a computer program product is intended to be equivalent to reference to a computer-readable medium containing instructions for controlling a computer system to coordinate the performance of the method. Reference to "at least one computer" is evidently intended to highlight the possibility for the present disclosure to be implemented in a distributed/modular fashion.

As mentioned in the foregoing, the present disclosure provides solutions regarding a method for testing a digital electronic circuit to be tested, comprising a voltage regulator supplying a digital supply voltage to internal digital circuitry of said electronic circuit, said voltage regulator comprising an op-amp voltage regulator comprising differential inputs coupled respectively to its output by a negative feedback network and to a reference voltage, said method comprising performing an ATPG, Automatic Test Pattern Generation, procedure comprising controlling a value of said digital supply voltage at the input of said internal digital circuitry according to a given test pattern, comprising during the execution of the ATPG procedure selectively coupling an external test equipment to the electronic circuit to apply to said electronic circuit an external voltage signal which value is controlled by the external test equipment, and measuring the digital supply voltage at the input of the internal digital circuitry at the external test equipment wherein said method includes applying a voltage on said differential inputs of the operation amplifier obtained from said external signal applied by the external equipment through an adaptation circuit (R3; 133, 132; R5, R6; R3, R2*a*, R2*b*) to obtain determined values of digital supply voltage at the output of said regulator and at the input of said internal digital circuitry.

In variant embodiments, the solution here described may include that said external signal is an analog signal carrying an external voltage and said selectively coupling includes closing a testmode switch in said adaptation circuit coupling an input of said circuit to a circuit arrangement applying a voltage on said differential inputs of the operation amplifier which is function of said external voltage.

In variant embodiments, the solution here described may include that said external signal is a digital signal carrying digital voltage values and the adaptation circuit comprises a digital to analog converter converting said external signal in a voltage value which is applied to a reference input of said operation amplifier and a switch to disconnect the reference voltage from the reference input.

In variant embodiments, the solution here described may include that said adaptation network comprises a resistor coupled to the feedback network.

In variant embodiments, the solution here described may include that said resistor is coupled to a central node of the feedback network directly coupled to the inverting input of the op-amp.

In variant embodiments, the solution here described may include that said resistor is coupled to a peripheral node of the feedback network, in particular a node between the output of the regulator and the node directly coupled to the inverting input of the op-amp.

In variant embodiments, the solution here described may include that said adaptation network comprises a resistor coupled to the positive input of said operation amplifier.

In variant embodiments, the solution here described may include that said ATPG procedure includes varying said voltage applied on said differential inputs of the operation amplifier by said external equipment, measuring said digital supply value at the input of the internal circuitry, performing said variation until the measured digital supply voltage reaches a desired voltage target value.

In variant embodiments, the solution here described may include that the feedback network is configured as a resistive divider comprising a second resistor coupled between the output and said central node coupled to the inverting input and a first resistor coupled between said central node and a supply ground node of the d, said adaptation circuit further comprising a fourth resistor coupled to a ground terminal of the internal digital circuitry, said ground terminal being coupled through a ground path of the internal digital circuitry to a respective terminal coupled to the supply ground node of the external equipment, a selection network being provided to disconnect the first resistor from the supply ground during the execution of the ATPG procedure and to connect the fourth resistor to the ground terminal of the internal digital circuitry.

The present disclosure provides also solutions regarding a system for testing comprising an electronic circuit to be tested, comprising a voltage regulator supplying a digital supply voltage to internal digital circuitry of said electronic circuit, said voltage regulator comprising an op-amp voltage regulator comprising differential inputs coupled respectively to its output by a negative feedback network and to a reference voltage, an external test equipment selectively couplable during the execution of an ATPG procedure to the electronic circuit, comprising a module configured to apply to said electronic circuit an external voltage signal which value is controlled by the external test equipment, and comprising a voltage meter to measure the digital supply voltage at the input of the internal digital circuitry, wherein said system is configured to perform the operations of the method according to any of the previous embodiments.

In variant embodiments, the system here described may also include that said module configured to apply to said digital electronic circuit is an analog voltage source and said external signal is an analog signal carrying an external voltage and said selectively coupling includes closing a testmode switch in said adaptation circuit (R3; 133; R5, R6; R3, R2a, R2b) coupling an input of said electronic circuit to a circuit arrangement applying a voltage on said differential inputs of the operation amplifier which is function of said external voltage.

In variant embodiments, the system here described may also include that said module configured to apply to said digital electronic circuit is a bus controller and said external signal is a digital signal carrying digital voltage values and the adaptation circuit comprises a bus, coupled to said digital to analog converter (133 configured to converting said external signal in a voltage value which output is coupled to a reference input of said operation amplifier and a switch to disconnect the reference voltage from the reference input The present disclosure provides also solutions regarding a computer-program product that can be loaded into the memory of at least one processor and comprises portions of software code for implementing the method of any of the previous embodiments.

BRIEF DESCRIPTION OF THE DRAWINGS

Embodiments of the present disclosure will now be described with reference to the annexed drawings, which are provided purely by way of non-limiting example and in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification is not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
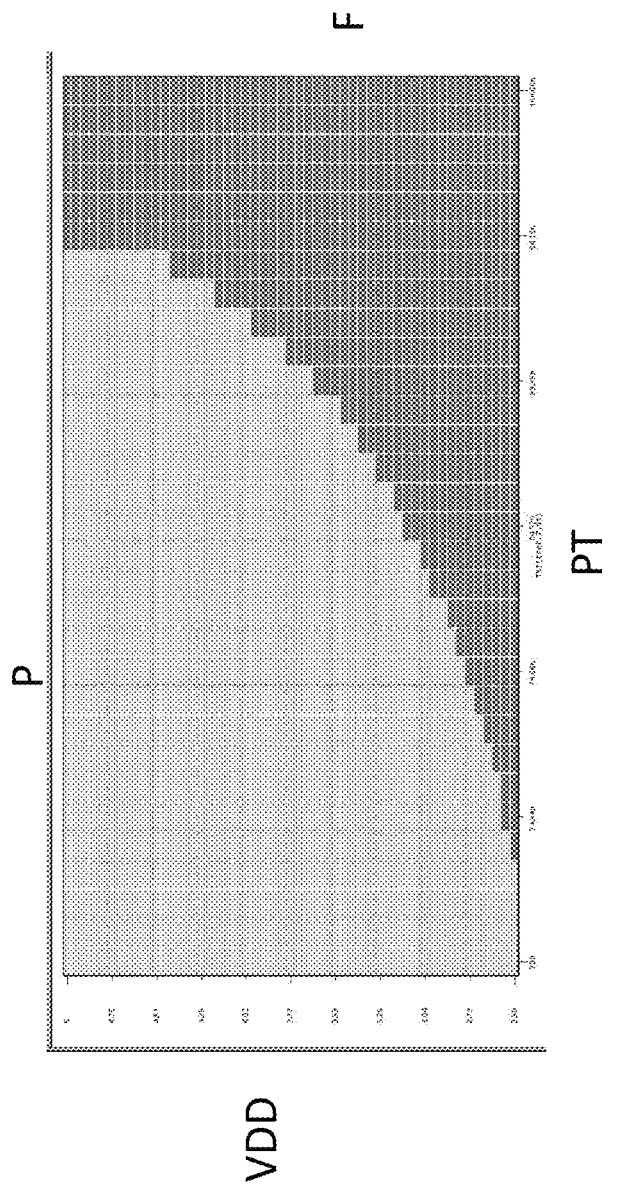
FIG. 1 shows Shmoo plot examples.

Figures parts, elements or components which have already been described with reference to FIG. 1 are denoted by the same references previously used in such Figures; the description of such previously described elements will not be repeated in the following in order not to overburden the present detailed description.

In brief, the solution here described provides: performing the internal regulation of the supply voltage during the ATPG patterns by forcing an external voltage on from ATE external equipment on the input terminals of the linear regulator amplifier; choosing the value of the external voltage in order to increase or decrease the digital supply voltage VDD value in a range useful for ATPG patterns; obtaining the desired value of the digital supply voltage VDD through a control loop: digital supply voltage value VDD supplied internally in the integrated circuit is monitored through the ATE external equipment and the value of external voltage is changed until the internal digital supply voltage VDD reaches the desired target value, i.e., the value desired according to the test pattern being performed.

Figure 4:
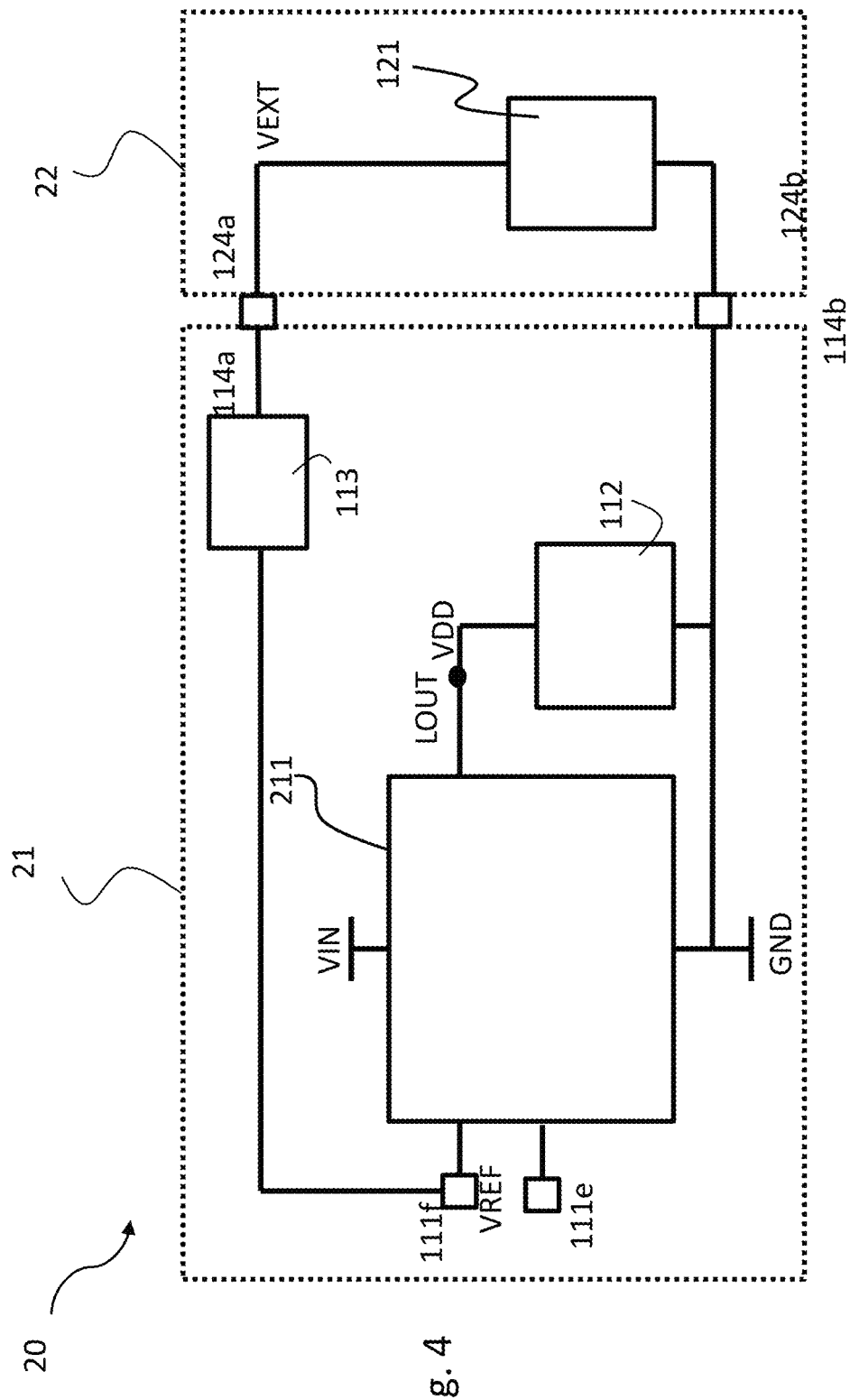
FIG. 4 shows another system of a regulator and an Automated Test Equipment.

FIG. 4 shows a schematic of a circuit arrangement of a test system configured to implement a method according to the proposed solution, indicated as a whole with the numerical reference 20. Also the arrangement 20 includes an integrated circuit 21 comprising a linear regulator 211 receiving an input voltage VIN and a reference voltage VREF, at terminal me, and outputting the digital voltage supply VDD, which is supplied to an integrated circuit logic 112, which is representative of the circuits of the integrated circuit 21 needing a digital voltage supply VDD, coupled in parallel with respect to an output terminal LOUT, on which is formed the digital voltage supply VDD of the linear regulator 211, and to a ground terminal GND of the linear regulator 211. The integrated circuit 21 includes test terminals, a force test terminal 114a, and a ground test terminal 114b, which is coupled to a ground node GND of the IC logic 112.

Reference numeral 22 indicates the ATE (Automated Test Equipment) which terminals 124a and 124b are coupled to terminals 114a and 114b respectively and coupled to the terminals of a voltage source 121.

Figure 2:
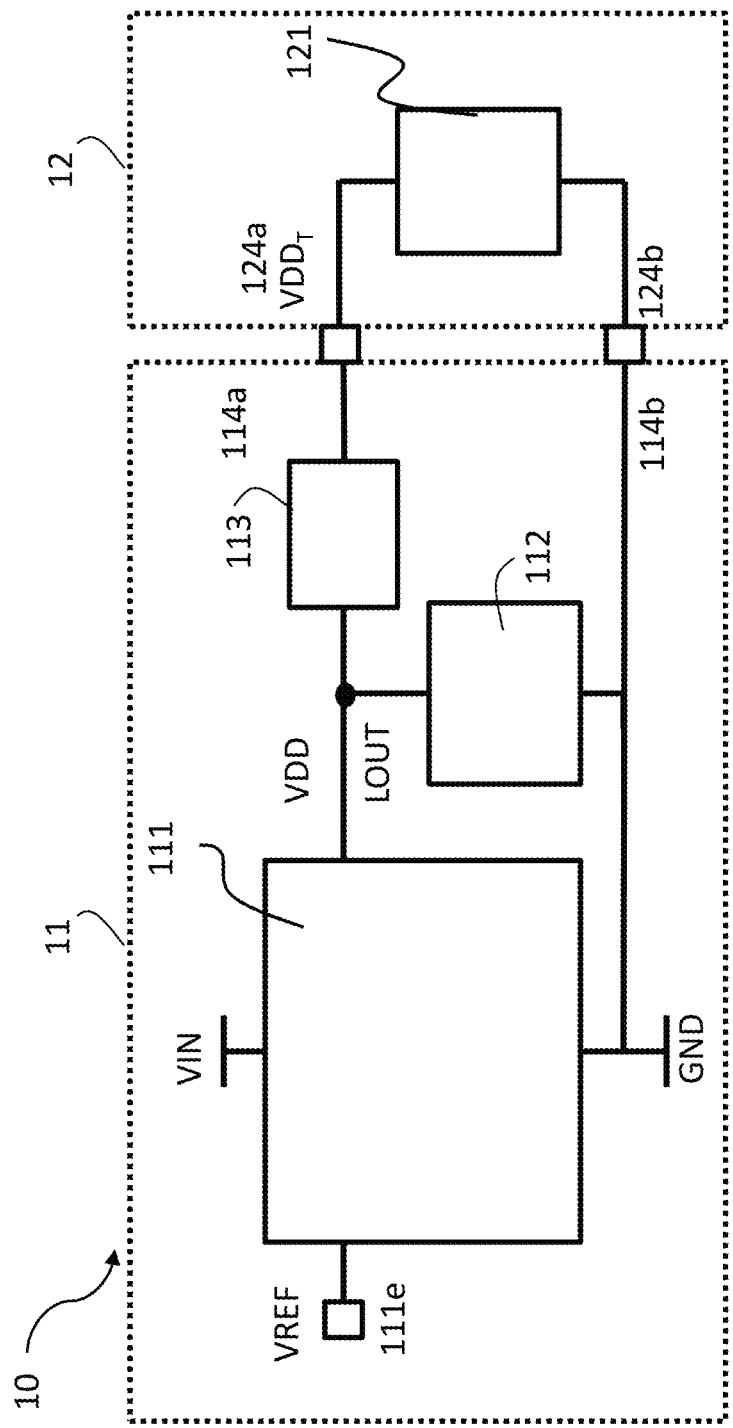
FIG. 2 shows a system of a regulator and an Automated Test Equipment.

However, with respect to the arrangement of FIG. 2, in the arrangement 20 the force test terminal 114a, which is an input of the electronic circuit or integrated circuit 21, is coupled, with the interposition of the testmode switch 113, to a control terminal 111f of the regulator 111, which control terminal 111f is coupled to so that the voltage there applied determines the differential input voltage of the op amp 111a, i.e., the differential voltage between its positive input and negative or inverting input. This means that the regulator output node, i.e. regulated voltage output node LOUT, is only coupled to the supply terminal 112a of the IC logic.

During the ATPG pattern, the regulator 211 is enabled, the testmode switch 113 is closed, the IC Logic 112 is configured in ATPG mode, which is a specific configuration required for the testing which may vary with the test and the ATE external voltage source 121 provides to the control terminal 111f an external voltage VEXT, thus controlling the input of the op-amp 111a.

The circuit arrangement of FIG. 4 allows different implementations.

In a first embodiment, the digital voltage supply VDD value may be varied by forcing an external voltage VEXT on the central node D of the negative feedback resistor divider.

In a second embodiment the digital voltage supply VDD value may be varied by coupling an internal digital to analog converter, or DAC, to the control terminal 111f.

In a third embodiment the digital voltage supply VDD value may be varied by forcing the external voltage VEXT on a reference resistor divider.

In a fourth embodiment the digital voltage supply VDD is varied by forcing the external voltage VEXT on a peripheral node of the negative feedback resistor divider.

Figure 3:
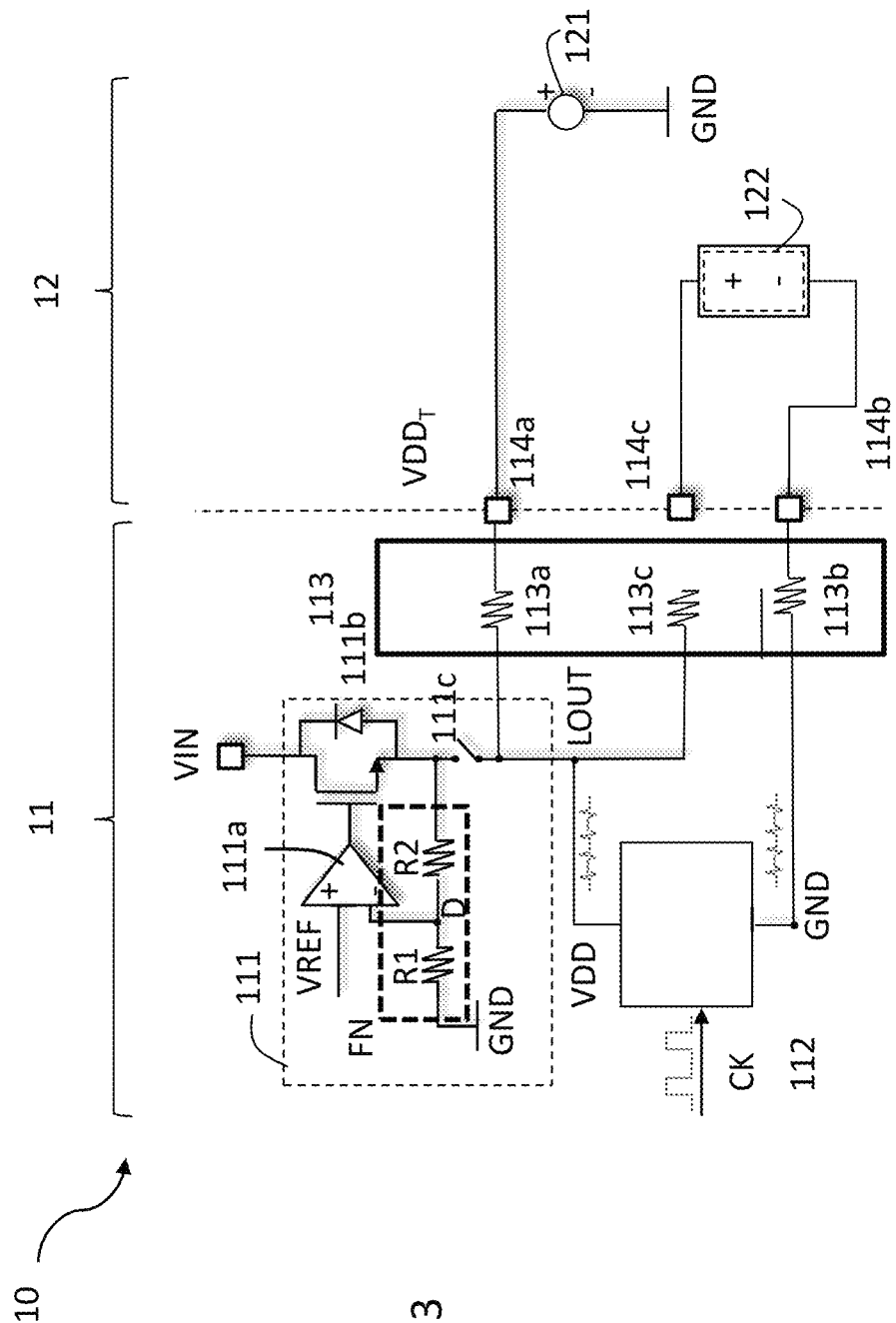
FIG. 3 shows a detail of the system of the regulator and the Automated Test Equipment of FIG. 2.
Figure 5:
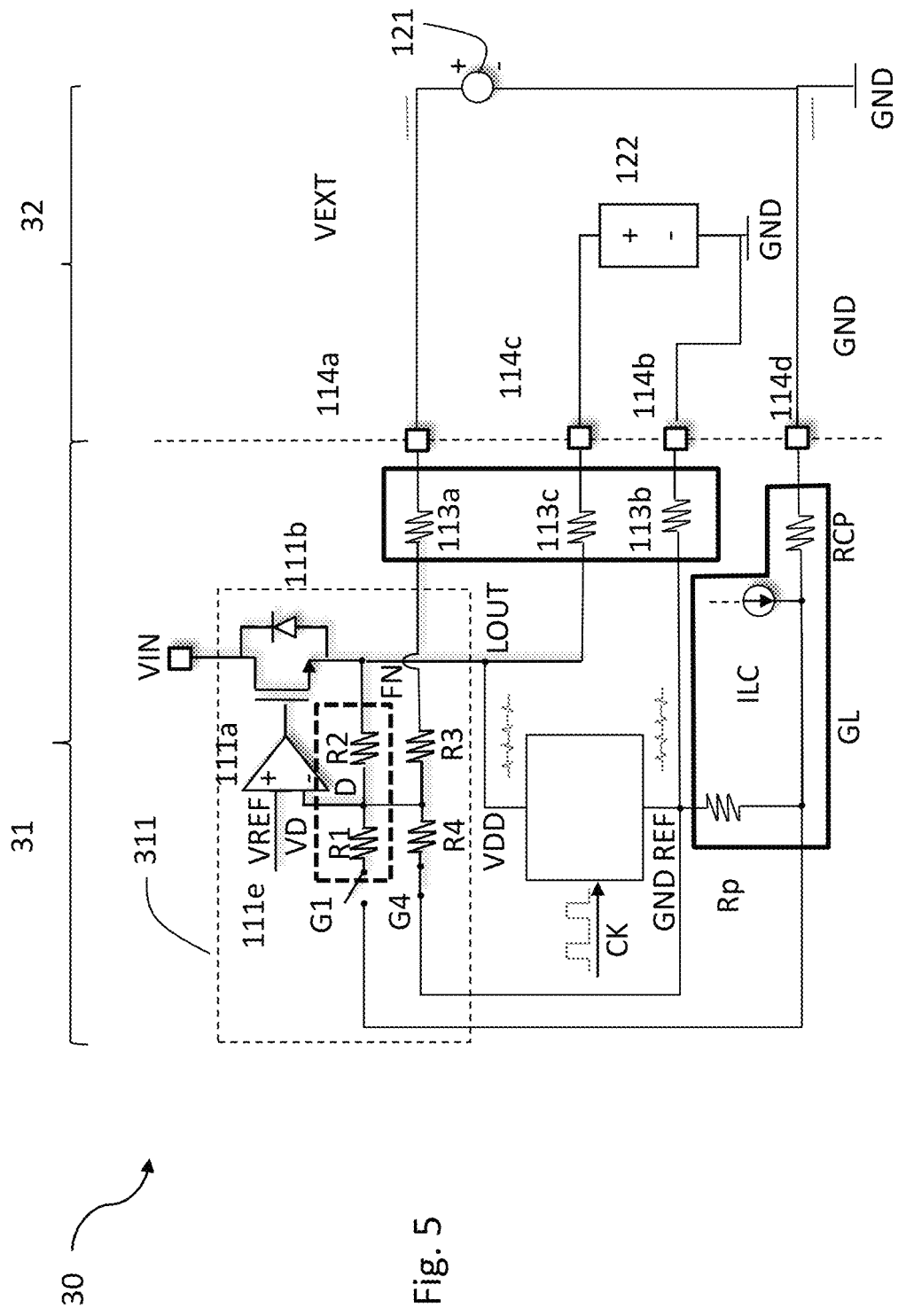
FIG. 5 schematically represent a first embodiment of the system of FIG. 4.

A first embodiment 30 of a test system according to the general schematics of FIG. 4 is shown with reference to FIG. 5, which represent a circuit implementation where a linear regulator 311 in the electronic circuit 31 is obtained by an op-amp 111a, like in FIG. 3. With respect to the circuit of FIG. 3, a further third resistance R3 is coupled between the central node D of the resistors R1 and R2 already indicated with reference to the divider FN FIG. 3, and the force test terminal 114a of the integrated circuit 11, which is coupled to the voltage source 121 in the ATE 32 which provides the external voltage VEXT during execution of ATPG. A fourth resistance R4 is coupled to a reference ground node GND_REF, which is the ground terminal of the IC logic 112. In FIG. 5 it is also shown the model of a ground loop GL, representative of a path which in digital circuits can couple their ground terminals, i.e. reference ground node GND_REF, to the supply ground node GND. Such reference ground node GND_REF is shown coupled to the supply ground GND through a parasitic resistance Rp and a common path represented by resistance RCP, while a current generator ILC represents the current injected in the node between parasitic resistance Rp and common path CP by the load contribution.

The two ground nodes, supply ground GND and reference ground GND REF, are used as force and sense paths for ground voltage.

The supply ground GND is used to force voltage on the force test terminal 114a of the integrated circuit and a high current flows into such terminal 114a.

The reference ground node GND_REF of IC logic 112 is coupled through a testmode switch 113b to a respective ground test terminal 114b of the integrated circuit 31, coupled to the supply ground terminal GND of the voltage meter 122, which is the ground GND in the ATE 32, while the other terminal of the voltage meter 122 is coupled through terminal 114c and respective testmode switch 113c to the regulated voltage output node LOUT as in FIG. 3. The voltage meter 122 is a voltage measuring device or circuit, which supplies to a measure voltage value to a control module of the ATE 32, not shown in the figure, which also controls the voltage source 121, i.e. controls the value of the external voltage VEXT and the time variation of such external voltage VEXT according to the test pattern.

A further test terminal 114d is provided in the integral circuit 21 coupled to the supply ground GND in the ATE 32 to which is coupled the generator 121, which is coupled to the reference ground node GND_REF through the ground loop GL, i.e. the series of resistors Rp and RCP with injection of current ILC in their common node.

The reference ground GND_REF is used as sense for ATE multimeter, i.e. voltage meter 122, which has one of its sense terminals coupled through terminal 114c to the terminal receiving the digital voltage supply node VDD of the IC logic 112, and the other sense terminal, coupled to the supply ground GND in the ATE 32, also coupled to the reference ground GND_REF through terminal 114b in order to read correctly the digital voltage supply value VDD across the IC logic 112, i.e. the difference between the digital voltage supply value VDD and GND REF voltage.

The absence of a reference ground GND_REF reading may lead to an error on reading of the voltage on the ground GND, due to internal drop, caused by the parasitic resistance between IC logic 112 and GND pin.

Thanks to voltage meter 112 reading of the reference ground GND REF node, possible drops due to ILC load and spike during ATPG patterns are not present on the sense measure determined by the sense terminal coupled to ground GND.

The testmode switch block 113, like in FIG. 3, includes testmode switches 111a, 113b and 113c coupled to each of the test terminals 114a, 114b and 114c.

The digital supply voltage VDD value in the circuit 30 of FIG. 5 is varied by forcing the external voltage VEXT on the central node D of the divider FN', i.e. coupling resistors R1, R2.

Linear regulation in the regulator 111 of FIG. 3 is determined by two factors: the reference voltage VREF at positive input of the op-amp 111a and the portion of output voltage VLOUT, sensed at the negative input of op-amp 111a through the voltage divider FN, which value is VLOUT*R1/(R1+R2). The voltage divider FN represents a feedback network to the negative input, determining a voltage control loop, which forces the voltage on the central node D of the divider FN, coupled to inverting terminal of op-amp 111a, to be equal to reference voltage VREF on the positive input. In this way, the ratio of the divider FN (and hence the current flowing into it) determines the value of output regulated voltage VLOUT on node LOUT as VREF*(R1+R2)/R1.

To change such divider ratio value, in the regulator 311 the third resistance R3 is coupled to the central node D of the resistor divider FN including resistors R1, R2, conveying a negative input voltage VD on the inverting input of the op-amp 111a. The other terminal of the further third resistance R3 is coupled to the force test terminal 114a in which voltage source 121 forces the external voltage VEXT used to test digital supply voltage VDD, through the testmode switch 113a, which is dimensioned so that the resistance of switch is not relevant, determining a negligible voltage drop, e.g., is hundreds of ohms if the third resistor is in the range of hundreds of kOhm, i.e. higher by a factor of thousand.

The external voltage VEXT forced by the voltage source 121 on the force test terminal 114a varies between a higher and lower value with respect to the negative input voltage VD on the central node D, thus creating a positive or negative current flowing in the central node D. The result is that the regulator output voltage VLOUT of the linear regulator, i.e. the supply voltage VDD supplied to the supply input terminal of circuit 112, can be higher or lower than the nominal value. The minimum and maximum reachable values depend on the value of the third resistance R3 and on the voltage applied to the force test terminal, or terminal, or pin, 114a, i.e. the external voltage VEXT. By way of example, the external voltage VEXT could be varied from 0 to 2V which corresponds respectively a variation of VLOUT from 4.6 to 2.3V.

Each of resistors R1 and R4 can be selectively coupled to the respective ground node, the terminal 114d coupled to the supply ground node GND in the ATE 32, possibly closest as possible to the ground terminal of resistor R1 to minimize the common path resistance RCP, and the ground reference node GND REF for the fourth resistor R4 by a respective grounding switch G1, G4. In other words, if the ground terminal coupled to resistor R1 is close to terminal 114d the common path resistance RCP is minimized.

During the test pattern execution, the regulator reference ground is coupled to the reference ground GND REF by disconnecting resistor R1 from it, opening switch G1, and coupling instead the fourth resistor R4, closing switch G4. This feature avoids a ground shift between the logic 112 and regulator 311, bypassing logic resistive path to ground. Of course, during normal operation outside ATPG execution, G1 is closed and G2 is open. R1 and R4 have the same value, to maintain the divider ratio.

The digital supply voltage VDD target value on node LOUT is obtained by ATE external equipment 32 by a control loop: the voltage across IC logic 112 is sensed through dedicated testmode switches 113c and 113b and the voltage on divider, in this case formed by R2, R3 and R4, is forced accordingly, in particular by control of the control module of the ATE 32.

Typical value for the negative input voltage VD is 1.2V, resistances R1, R2, R3 and R4 are in the order range of hundreds of kOhm, testmode switches 113 have resistances in the range of hundreds of Ohm, typical digital voltage supply values VDD could be 3.3V, 1.8V, 1.2V and so on.

Figure 6:
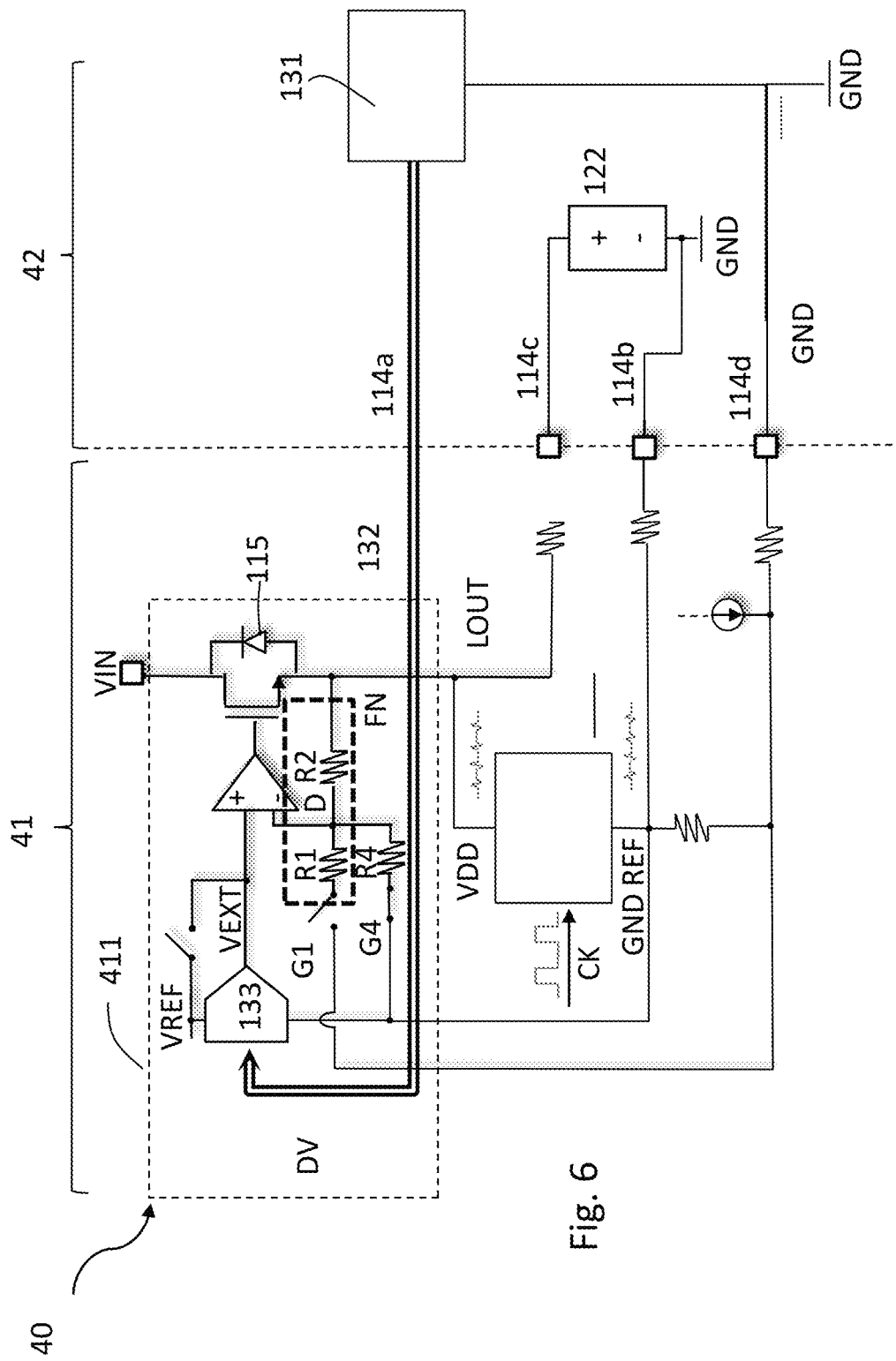
FIG. 6 schematically represent a second embodiment of the system of FIG. 4.

In a second embodiment 40, shown in FIG. 6, the digital voltage supply voltage VDD is varied by coupling an internal digital to analog converter, or DAC to the positive input.

As shown in FIG. 6, the ATE 42 in this case includes a bus controller 131, which through a bus 132 sends digital values DV to a digital to analog converter 133 in the regulator 411, which converts them in analog external voltage VEXT. In this case the regulator 411 includes the divider FN comprising only two resistors R1, R2, like in FIG. 3. The fourth resistance R4 is also provided, which is used for selective coupling with GND_REF as in the circuit of FIG. 5. The supply terminal of the digital to analog converter 133 are coupled to GND_REF and to the reference voltage VREF, which is coupled to the positive input of op-amp 111 through a controlled switch 115. The analog output of the digital to analog converter 133, supplying the output voltage VEXT, is coupled to the positive input of op-amp 111a as well. The inverting input is coupled to the central node D of the divider FN, as in FIG. 5. The test terminals 113b, 113c are coupled like in FIG. 5, while the force test terminal 114a is embodied in this case by the coupling to the electronic digital circuit 41 of bus 132 carrying the digital signal forced by the controller 131 in the ATE 42. In this case the force test terminal 114a may be embodied by a serial communication interface.

Thus, during the normal operation the switch 115 is closed (G1 is closed, G4 is open), so that the op-amp 111a operates with the reference voltage VREF and the voltage fed back on node D by the divider FN. The ATE 42 is not operating thus there is no voltage at the output of the digital to analog converter 133.

During the execution of ATPG, the switch 115 is open (G1 is open, G4 is closed), the ATE 12 sends on the bus 132 through the bus controller 133, digital values DV which are converted in the external voltage VEXT at the output of the digital to analog converter 133 and supplied to the positive input, instead of the reference voltage VREF.

Since the digital to analog converter 133 is supplied with the reference voltage VREF, the external voltage VEXT may range, if the digital to analog converter 133 is realized to operate with a number n bits, from ground GND value, e.g. zero volts, to the reference value VREF with a step equal to $VREF/2^n$, i.e. the ATE 42 determines which fraction of the reference voltage VREF the external voltage VEXT is.

If the resistor divider FN, including resistors R1, R2, has been designed in order to obtain a given nominal value of digital supply voltage VDD when the external voltage VEXT is equal to VREF/2, then it is possible to decrease or increase the value of test digital supply voltage VDD at the output of transistor 111b, by programming on digital to analog converter 133 an output voltage lower or higher than VREF/2 respectively.

Also, in this case the regulator reference ground is connected to GND REF by disconnecting R1 and connecting R4, during the ATPG to avoid ground shift between logic and regulator, bypassing logic resistive path to ground.

Digital supply voltage VDD target value is obtained by ATE external equipment with a control loop, i.e. the voltage meter 122: voltage across IC logic 112 is sensed through dedicated testmode switches and the external voltage VEXT is programmed accordingly, by setting the digital values DV.

Typical value of the reference voltage VREF may be 1.2V, number of bits n may be 8, resistances (R1, R2 and R4) are in the order of hundreds of kOhm, testmode switches are in the order of hundreds of ohm, and typical digital supply voltage VDD could be 3.3V, 1.8V, 1.2V and so on.

Figure 7:
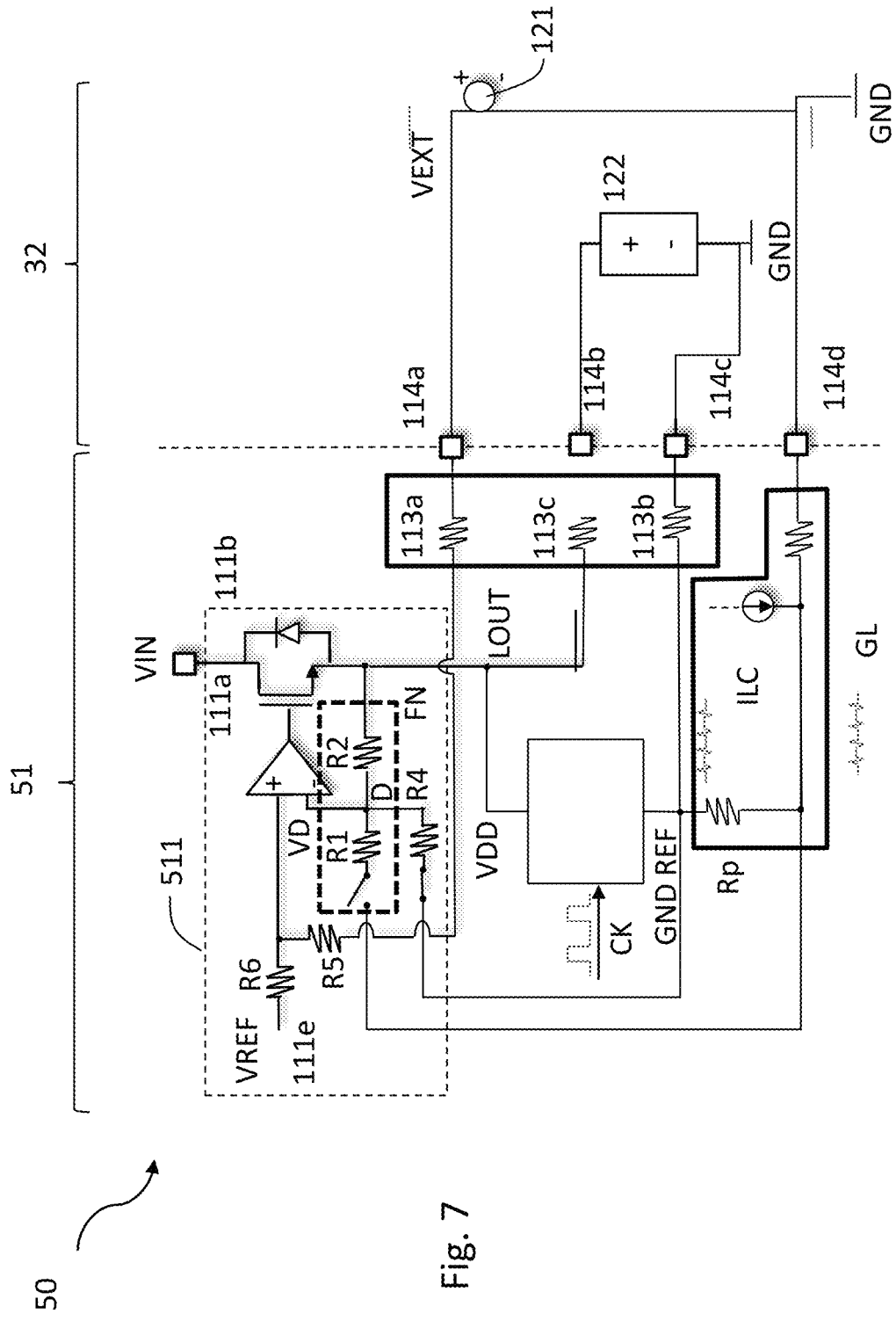
FIG. 7 schematically represent a third embodiment of the system of FIG. 4.

In a third embodiment 50, shown in FIG. 7, the digital supply voltage VDD is varied by forcing the external voltage VEXT on a reference resistor divider.

The voltage source 121 in the ATE 52 in this case is coupled through force test terminal 114a, a testmode switch 111a and a series resistor R5 to the positive input node of the op-amp 111a, to which also the reference voltage VREF through the interposition of a corresponding series resistor R6 is coupled. Also in this case, the resistance of the testmode switch 113a is not relevant compared to the other resistances.

When, during the ATPG execution, the external voltage VEXT is applied to the resistor divider formed by R5, R6 in the regulator 511 of the electronic circuit 51, the value of the voltage applied to the positive input changes from the reference voltage VREF, and, as a consequence, the value of the output of the linear regulator 111a and the digital supply voltage VDD change accordingly.

The value of digital supply voltage VDD can be increased or decreased from its typical value by forcing an external voltage VEXT higher or lower than reference voltage VREF.

Also in this case during ATPG execution the regulator reference ground is connected to GND REF by disconnecting R1 and connecting R4, during the ATPG execution. This feature avoid ground shift between logic and regulator, bypassing logic resistive path to ground.

Digital supply voltage VDD target value is obtained by ATE external equipment with a control loop, i.e. the voltage meter 122: voltage across IC logic 112 is sensed through dedicated testmode switches and negative input voltage VD is programmed accordingly.

Typical value of reference voltage VREF is 1.2V, resistances (R1, R2, R3, R4 and R5, R6) are in the order of hundreds of kOhm, testmode switches are in the order of hundreds of Ohm, and typical VDD could be 3.3V, 1.8V, 1.2V and so on.

Figure 8:
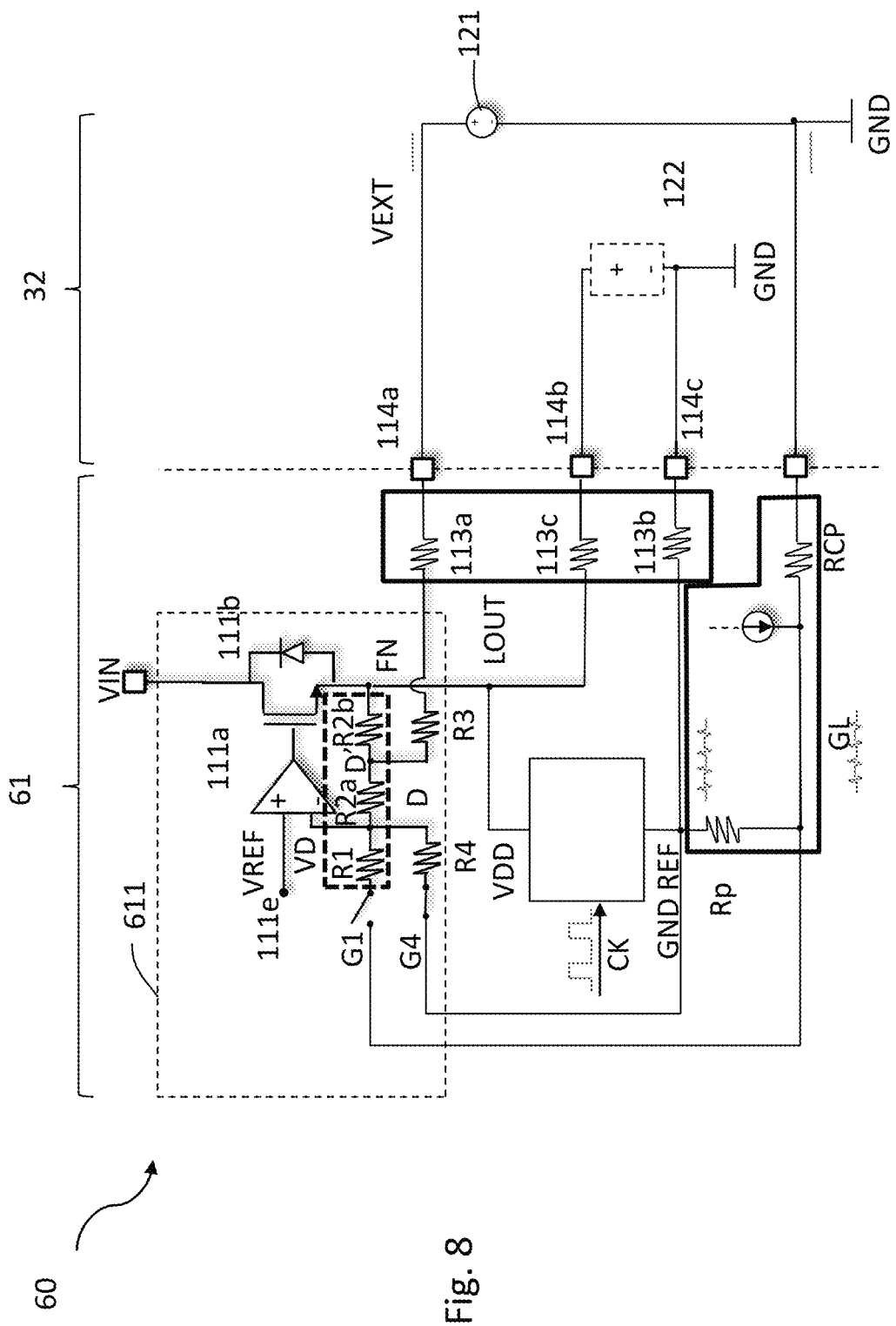
FIG. 8 schematically represent a fourth embodiment of the system of FIG. 4.

In a fourth embodiment 60, shown in FIG. 8, the VDD voltage is varied by forcing external voltage on a peripheral node of the negative feedback resistor divider.

The circuit arrangement of the electronic circuit 61 and ATE 32 corresponds substantially to that of FIG. 3, however in the regulator 611 the resistor R2 in the feedback network FN includes two resistors in series, a resistor R2b coupled to the source of transistor 111b and a resistor R2a coupled to resistor R1, resistor R2b and resistor R2a being coupled in a second peripheral node D', to which third resistor R3 is coupled, being coupled by its other terminal to the force test terminal 114a of the integrated circuit 61, which is coupled to the voltage source 121 which forces the external voltage VEXT during execution of ATPG. As in the other embodiments of FIGS. 5 and 7, the testmode switch 113a is arranged between terminal 114a and the third resistor R3.

During ATPG execution, the external voltage forced on the force test terminal 114a and then on the inverting terminal of the op-amp 111a is varied between higher and lower values than the reference voltage VREF, thus creating a positive or negative current into central node D. The result is that the output voltage VLOUT, and then digital supply voltage VDD can be set higher or lower than the nominal value. The minimum and maximum value reachable depends on the value of the resistors R3, R2a, R2b, and the voltage applied to the pin.

Also in this case during ATPG execution the regulator reference ground is connected to GND REF by disconnecting R1 and connecting R4, during the ATPG. This feature avoids ground shift between logic and regulator, bypassing logic resistive path to ground.

The target value of digital supply voltage VDD is obtained by the ATE external equipment 12 with a control loop: voltage across IC logic is sensed through dedicated testmode switches at the meter 122 and the voltage on the divider FN is forced accordingly.

Typical value for reference voltage VREF is 1.2V, resistances (R1, R2a, R2b, R3 and R4) are in the order of hundreds of kOhms, testmode switches are in the range of hundreds of Ohms, typical VDD could be 3.3V, 1.8V, 1.2V and so on.

Figure 9:
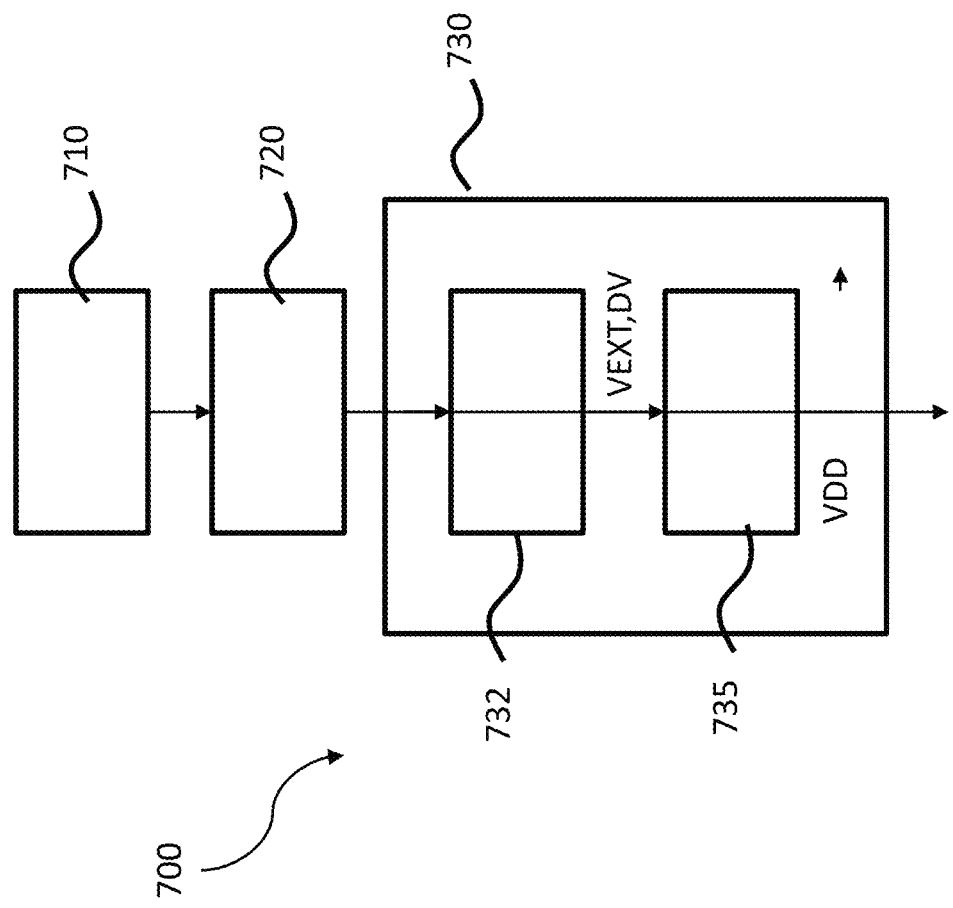
FIG. 9 is a flow diagram representing operations of the method according to embodiments.

In FIG. 9 it is shown a flow diagram representing operations of an embodiment of the method here described when a test is applied to circuit 11, indicated with the reference 700.

In a step 710, the electronic circuit 21 (or 31, or 41, or 51, or 61) is set in the ATPG mode and the testmode switches 113, in particular the test mode switch associated to the input terminal 114a, are closed. Also the grounding switches G1, G4 may be set in the state required for the ATPG, as indicated above.

In a step 720 the ATE 22 (or 32 or 42) is coupled to the digital electronic circuit 11, coupling in particular the voltage source 121 to the terminals 114a (force test), 114d (supply ground) or the bus controller 132 to the bus input on the electronic circuit 11, and the voltage meter 122 to the sensing terminals 114b, 114c of the circuit 21.

Step 710 and 720 may be performed at the same time or in different order.

Then an ATPG procedure 730 is performed comprising a step 732 of applying to said electronic circuit 21, by voltage applying module which can be embodied by the analog voltage source 121 or the bus controller 132, an external voltage signal, which may an external analog voltage VEXT or digital data DV in the embodiment of FIG. 6, which value is controlled by the external test equipment 22. Such step 732 includes applying a voltage on the differential inputs, i.e. positive input or reference input and negative or inverting or feedback input, of the operational amplifier 111a, a voltage which is obtained from said external signal VEXT, DV applied by the automated test external equipment 22 through an adaptation circuit, i.e. a resistive network or a bus and a digital to analog converter, to obtain determined values of digital supply voltage VDD at the output of said regulator 211 and at the input of said internal digital circuitry 112.

In a step 735 is performed the measuring at the external test equipment 22, specifically at the voltage meter 122, of the digital supply voltage VDD which forms at the input of the internal digital circuitry 112 as a consequence of the external voltage signal VEXT, applied.

The ATPG procedure 730 may include varying said voltage applied on said differential inputs of the operation amplifier 111a by said external equipment 22, measuring 122 said digital supply value VDD at the input of the internal circuitry 112, performing said variation until the measured digital supply voltage VDD reaches a desired voltage target value according to the test requirements. In FIG. 9 this is represented by a return to the beginning of the procedure 730 after the execution of measuring 735, i.e. a plurality of external voltage VEXT values is applied in time, measuring the corresponding digital supply voltage VDD until a setpoint or target value is reached. Of course, in various embodiments the procedure with voltage variation 732 and measurement 735 may be also different.

The operation of the method 700 can be performed under the control of control modules, in particular processor containing modules, which can be located in the automated test external equipment 22, although some control may be performed also by modules in the digital electronic circuit 11.

The external equipment preferably comprises a control module, for instance comprising a processing unit, which controls the operation (732, 735) of the voltage source or bus controller, the voltage meter, and sends signals to operate the testmode switches and the switches selecting the ground terminals (i.e. G1, G2) (operation 710). Of course, in various embodiments, control can be distributed in more modules, and also such control module or modules can be included in the digital electronic circuit to be tested. In particular, the ATPG mode configuration of the digital electronic circuit may include setting the switches the testmode switches and/or the switches selecting the ground terminals in the state requested by the method here described during the execution of the ATPG procedure.

Thus summing up, in general the testing method here described includes applying a voltage on the differential input of the operation amplifier 111a, which is obtained through an adaptation circuit, e.g. resistor R3 coupled to node in FIG. 5, or the analog to digital converter in FIG. 6 supplying the voltage to the positive input of the operation amplifier 111a, or resistor R5, R6, combining the voltage VEXT with the reference voltage VREF in FIG. 6, or resistor R3 coupled to the peripheral node D' between resistor R2a, R2b, from said external signal, i.e. the analog signal VEXT or the digital values DV applied by the external equipment to obtain determined values of digital supply voltage VDD, i.e. the values required by the test, at the output of the regulator 211 (or 311, or 411, or 511, or 611) and at the input of the internal digital circuitry 112.

In the embodiment of FIG. 5 the differential voltage at the inputs of the op-amp ma is controlled by controlling the voltage, applying external voltage VEXT through the adaptation circuit, at the negative input, like in the embodiment of FIG. 6. In the embodiment of FIGS. 6 and 7 the adaptation circuit is coupled to the positive input, in FIG. 6 through the converter disconnecting the reference voltage VREF, in FIG. 7 by applying the reference voltage VREF and the voltage obtained through the adaptation network (divider R5, R6) to the same reference input node.

Thus, the method and system here described allow advantageously to improve the control of logic gates supply voltage with benefits on stability of ATPG patterns. The supply voltage can be brought close to the sign off voltage with more precision, helping to highlight better defectiveness. Also, a reduction of false rejection is obtained.

These aspects improve stability of ATPG test program during production.

Also, the current forced by the external generator is low, thus no testmode force switches for high currents are required, with circuit area saving.

It is possible to create stable Schmoo plot, not limited by the switch resistance.

Also, the resistive path between the digital voltage supply and the main digital circuitry/logic is low, e.g. 1 Ohm, negligible respect to resistance of known solution, which is for instance of 50 Ohms).

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A method for testing a digital electronic circuit, wherein the digital electronic circuit comprises a voltage regulator configured to supply a digital supply voltage to internal digital circuitry of the digital electronic circuit, and wherein the voltage regulator comprises an op-amp voltage regulator having differential inputs coupled respectively to an output of the op-amp voltage regulator by a negative feedback network and to a reference voltage, the method comprising:
coupling an external test equipment to the digital electronic circuit in order to apply an external voltage signal to the digital electronic circuit when an automatic test pattern generation (ATPG) procedure with a given test pattern is performed, wherein a value of the external voltage signal is controlled by the external test equipment; and
measuring, at the external test equipment, the digital supply voltage at an output of the voltage regulator and at an input of the internal digital circuitry,
wherein the external voltage signal is applied to the differential inputs of the op-amp voltage regulator through an adaptation circuit to obtain determined values of the digital supply voltage.

2. The method according to claim 1, wherein the external voltage signal is an analog voltage signal, and wherein coupling includes closing a testmode switch in the adaptation circuit thereby coupling an input of the digital electronic circuit to the differential inputs of the op-amp voltage regulator.

3. The method according to claim 2, wherein the adaptation circuit comprises a third resistor coupled to the feedback network.

4. The method according to claim 2, wherein the adaptation circuit comprises a fifth resistor coupled to a positive input of the op-amp voltage regulator.

5. The method according to claim 3, wherein the third resistor is coupled to a central node of the feedback network, and wherein the central node is directly coupled to an inverting input of the op-amp voltage regulator.

6. The method according to claim 5, wherein the feedback network is a resistive voltage divider comprising a second resistor coupled between the output of the voltage regulator and the central node and a first resistor coupled between the central node and a supply ground node of the voltage regulator, wherein the adaptation circuit further comprises a fourth resistor coupled to a ground terminal of the internal digital circuitry, wherein the ground terminal is coupled through a ground path of the internal digital circuitry to a respective terminal of the digital electronic circuit coupled to a supply ground node of the external equipment, and wherein a selection network disconnects the first resistor from the supply ground while performing the ATPG procedure and to connect the fourth resistor to the ground terminal of the internal digital circuitry.

7. The method according to claim 5, wherein the third resistor is coupled to a peripheral node of the feedback network, and wherein the peripheral node is a node between an output of the voltage regulator and the central node.

8. The method according to claim 1, wherein the external voltage signal is a digital signal carrying digital voltage values, and wherein the adaptation circuit comprises a digital to analog converter converting the external voltage signal into a voltage value which is applied to a reference input of the op-amp voltage regulator and a switch to disconnect the reference voltage from the reference input.

9. The method according to claim 1, wherein the ATPG procedure comprises:
varying the external voltage signal applied to the differential inputs of the op-amp voltage regulator by the external equipment;
measuring the digital supply value at an input of the internal digital circuitry; and
performing the variation until the measured digital supply voltage reaches a desired target voltage value.

10. A system comprising:
a digital electronic circuit comprising:
internal digital circuitry;

a voltage regulator configured to supply a digital supply voltage to the internal digital circuitry, wherein the voltage regulator comprises an op-amp voltage regulator comprising differential inputs coupled respectively to its output by a negative feedback network and to a reference voltage; and an adaptation circuit;

an external test equipment configured to be coupled to the digital electronic circuit, the external test equipment comprising:

a module configured to apply an external voltage signal during an execution of an automatic test pattern generation (ATPG) procedure, wherein a value of the external voltage signal is controllable by the external test equipment, and a voltage meter configured to measure the digital supply voltage at an input of the internal digital circuitry, wherein the external voltage signal is applied to the differential inputs of the op-amp voltage regulator through the adaptation circuit to obtain determined values of the digital supply voltage at the input of the internal digital circuitry.

11. The system according to claim 10, wherein the external voltage signal is an analog voltage signal, and wherein the digital electronic circuit further comprises a testmode switch configured to couple an input of the digital electronic circuit via the adaptation circuit to the differential inputs of the op-amp voltage regulator.

12. The system according to claim 11, wherein the adaptation circuit comprises a third resistor coupled to the feedback network.

13. The system according to claim 11, wherein the adaptation circuit comprises a fifth resistor coupled to a positive input of the op-amp voltage regulator.

14. The system according to claim 12, wherein the third resistor is coupled to a central node of the feedback network, and wherein the central node is directly coupled to an inverting input of the op-amp voltage regulator.

15. The system according to claim 14, wherein the digital electronic circuit comprises a selection network, wherein the feedback network is a resistive voltage divider comprising a second resistor coupled between an output of the voltage regulator and the central node and a first resistor coupled between the central node and a supply ground node of the voltage regulator, wherein the adaptation circuit further comprises a fourth resistor coupled to a ground terminal of the internal digital circuitry, wherein the ground terminal is coupled through a ground path of the internal digital circuitry to a respective terminal of the digital electronic circuit coupled to a supply ground node of the external equipment, and wherein the selection network is configured to disconnect the first resistor from the supply ground while performing the ATPG procedure and to connect the fourth resistor to the ground terminal of the internal digital circuitry.

16. The system according to claim 14, wherein the third resistor is coupled to a peripheral node of the feedback network, and wherein the peripheral node is a node between an output of the voltage regulator and the central node.

17. The system according to claim 10, wherein the external voltage signal is a digital signal carrying digital voltage values, and wherein the adaptation circuit comprises a digital to analog converter configured to convert the external voltage signal into a voltage value applied to a reference input of the op-amp voltage regulator and a switch configured to disconnect the reference voltage from the reference input.

18. The system according to claim 10, wherein the ATPG procedure comprises:

varying the external voltage signal applied to the differential inputs of the op-amp voltage regulator by the external equipment;

measuring the digital supply value at an input of the internal digital circuitry; and performing the variation until the measured digital supply voltage reaches a desired target voltage value.

* * * * *